US006857042B1

(12) United States Patent
Floman et al.

(10) Patent No.: US 6,857,042 B1
(45) Date of Patent: Feb. 15, 2005

(54) METHOD FOR REFRESHING A DYNAMIC MEMORY

(75) Inventors: Matti Floman, Tampere (FI); Ari Aho, Tampere (FI); Markku Lipponen, Tampere (FI); Mikko Siltanen, Tampere (FI)

(73) Assignee: Nokia Mobile Phones, Ltd., Espoo (FI)

( * ) Notice: Subject to any disclaimer, the term of this patent is extended or adjusted under 35 U.S.C. 154(b) by 0 days.

(21) Appl. No.: 09/481,784

(22) Filed: Jan. 11, 2000

(30) Foreign Application Priority Data

Jan. 11, 1999 (FI) .................................................. 990038

(51) Int. Cl.$^7$ ............................................. G06F 12/00
(52) U.S. Cl. ..................................................... 711/106
(58) Field of Search ........................... 711/105–106, 5, 711/129, 173

(56) References Cited

U.S. PATENT DOCUMENTS

| 4,639,858 A | * | 1/1987 | Murray et al. ............... 711/106 |
| 5,148,546 A | | 9/1992 | Blodgett |
| 5,283,885 A | | 2/1994 | Hollerbauer |
| 5,469,559 A | | 11/1995 | Parks et al. |
| 5,557,578 A | | 9/1996 | Kelly |
| 5,721,860 A | * | 2/1998 | Stolt et al. ............. 365/230.01 |
| 5,923,829 A | * | 7/1999 | Ishii et al. ................... 365/227 |
| 6,212,599 B1 | * | 4/2001 | Baweja et al. ............... 711/106 |

FOREIGN PATENT DOCUMENTS

EP 0792077 A1 8/1997
EP 0820065 A2 1/1998

OTHER PUBLICATIONS

JP60175296 (Pub Sep. 9, 1985); JP3084794 (Pub Apr. 10, 1991).

JP4034628 (Pub Feb. 5, 1992); JP10255468 (Pub Sep. 25, 1998).

JP2192096 (Pub Jul. 27, 1990); JP9139074 (Pub May 27, 1997).

JP9290549 (Pub Nov. 11, 1997).

* cited by examiner

Primary Examiner—Matthew Kim
Assistant Examiner—Matthew D. Anderson
(74) Attorney, Agent, or Firm—Perman & Green, LLP

(57) ABSTRACT

A method for refreshing memory cells in a dynamic memory includes dividing the information stored therein at a given time into information to be maintained and information not requiring maintenance, wherein at least some of such memory cells containing information not requiring maintenance are left unrefreshed. In the method application programs are executed. The memory cells of the dynamic memory are divided into two or more blocks which can be refreshed irrespective of each other. Information on the location of each application program to be executed is stored, as well as on the quantity of memory allocated by each application program to be executed. In the method it is further determined on the basis of said stored information which of said memory blocks contains information requiring maintenance, wherein other memory blocks remains unrefreshed. The invention also relates to an electronic device.

7 Claims, 2 Drawing Sheets

METHOD FOR REFRESHING A DYNAMIC MEMORY

BACKGROUND OF THE INVENTION

1. Field of the Invention

Figure 1:
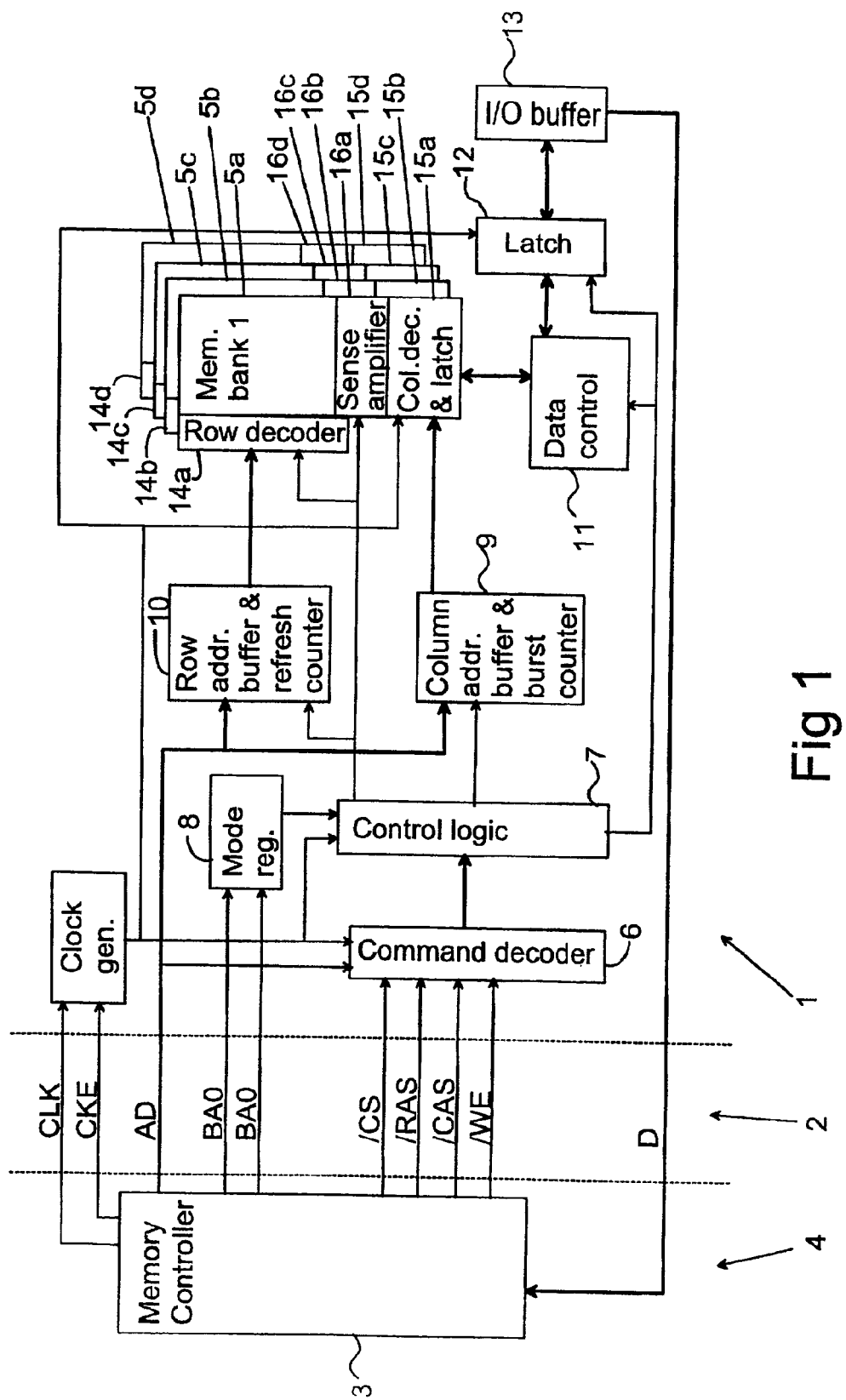

The invention relates to a method for refreshing memory cells in a dynamic memory, which memory cells are used for storing information, wherein the refreshing is conducted in order to maintain the information in the memory cells, the information stored in the memory cells at a given time is divided into information to be maintained and information not requiring maintenance, wherein at least some of such memory cells which contain information not requiring maintenance, remain unrefreshed, in which method application programs are executed. The invention also relates to an electronic device which comprises a dynamic memory containing memory cells for storing information, means for refreshing the memory cells, means for executing application programs, means for allocating a memory area from the dynamic memory for each application program for the duration of its execution, and means for deallocating said memory area after the execution of the application program.

2. Brief Description of Related Developments

Especially for temporary storage of data, random access memories (RAM), such as static random access memories (SRAM) and dynamic random access memories (DRAM), are used e.g. for the reason that they enable relatively fast reading and writing of data when compared with other rewritable memory types, such as the non-volatile random access memory (NVRAM).

In memory cells of static memories, the data written therein is maintained when a voltage is coupled to the memory, but in dynamic memories, the data written in the memory cells must be refreshed at regular intervals in order to maintain the data. In static memories, the memory cell is typically formed of several CMOS transistors, or the like. In dynamic memories, the memory cell typically comprises one CMOS transistor and a capacitor. Thus, the memory cell of a dynamic memory requires a smaller surface area and is less expensive than the memory cell of a static memory. Therefore, dynamic memories are used especially in applications requiring a large memory capacity. In the memory cells of the dynamic memory, a charge stored in the capacitance gradually fades away e.g. due to leakage currents. Thus, the memories have to be provided with means for maintaining (refreshing) the data (charge) stored in the memory cells at intervals. This increases the power consumption of the electronic device when compared with a situation where static memories are used as random access memories.

Especially in portable electronic devices, the aim is to minimize this power consumption in order to prolong the operating time of the device. The power consumption of the memory has not, however, been a significant drawback, because the memory quantity has been relatively small and a large share of the power consumption has been caused by other functions of the electronic device.

Lately, however, the features of portable electronic devices, such as communication devices have been developed, and the quantity of random access memory has been significantly increased. This is because e.g. the applications used in such portable electronic devices require more efficiency and memory capacity than before. The use of the static memory in such applications is restricted by the relatively high price of the static memory. Another restricting factor for the use of the static memory is the large size it requires, wherein the size of the device should be increased in order to implement the necessary memory capacity in the electronic device. However, the aim is to further reduce the size of portable electronic devices, and thus to use the dynamic memory as a random access memory.

There are primarily two types of dynamic memories, an asynchronous dynamic memory (DRAM) and a synchronous dynamic memory (SDRAM). Furthermore, there may be differences in the internal structures of memories of the same basic type, for example as regards the organization of the memory cells, cache memory, and a possible division into blocks (bank). The difference between asynchronous and synchronous memories lies primarily in the fact that in synchronous DRAM memories, data is written in bursts and in a synchronous manner controlled by a clock signal. In asynchronous and synchronous DRAM memories, the memory cells are organized in a matrix format, wherein the memory is provided with a control logic by means of which it is possible to indicate each memory cell of the matrix. The control logic comprises means for indicating a matrix row and means for indicating a matrix column. The address is typically transmitted in two phases in such a way that in the first phase a matrix row address corresponding to the target address is written in the memory and in the second phase a matrix column address is written in the memory. From these row and column addresses, the control logic of the memory produces a signal to indicate the correct memory cell in the matrix. Typically, these different row and column addresses are written on the same address lines with the difference that when writing the row address, the memory is informed of the row address in question by means of a separate row address strobe line (RAS), and correspondingly, when writing the column address, the memory is informed of the column address in question by means of a separate column address strobe line (CAS).

In an electronic device, the width of the data bus typically equals the width of a byte (8 bits), or its multiple (16, 32 bits). This can be implemented either in such a way that each bit is provided with one or more dynamic memory circuits (parallel coupling of the memory circuits), or that dynamic memory circuits are used which contain several memory matrices integrated therein, for example 8 matrices in parallel. These dynamic memories can also be implemented in such a way that they are integrated in connection with so-called ASIC circuits as is known by anyone skilled in the art.

In dynamic memory circuits of prior art, the refreshing of the memory is arranged in such a way that a memory refresh logic refreshes the memory at intervals, advantageously in such a way that the memory refresh logic indicates each matrix row at a time, reads the information content of this matrix row into an intermediate buffer and writes it back into this matrix row. The refresh logic goes through each matrix row and performs the aforementioned refresh procedures. The refreshing can be conducted either in a continuous manner or between other read/write operations, in such a way, however, that the maximum refresh sequence allowed is not exceeded in any memory cell of the matrix.

There are also known dynamic memories which are provided with a so-called self refresh function, wherein an external memory refresh controller initiates a self refresh function for the dynamic memory. Thus, an internal timer of the memory updates a refresh counter which is used to maintain information on the memory area (memory row) to be refreshed at a time. With respect to retaining data, it is important to refresh each memory cell sufficiently often in the self refresh function as well.

Especially for portable electronic devices, different functions for attaining savings in power consumption have been developed to obtain a longer operating time for the electronic device. There can be several such power down modes, and the savings in the power consumption attained thereby can vary. Such power down modes include for instance an idle state and a standby state. In these different power down modes, only some of the functions of the electronic device are active. For example the micro processing unit (MPU) of the electronic device does not execute a program code but waits for an activation strobe from the timer. In the power down mode it is, however, necessary to refresh the dynamic memories. If the memory refresh is implemented with a controller separate from the memories, this memory controller has to function also in the different power down modes. If memories including a refresh logic are used as a dynamic memory, the refresh logic has to function also in the different power down modes. Thus, the refresh functions of the dynamic memories form a major part of the power consumption in these power down modes. This problem becomes even worse, because the need for fast random access memory is increased in new electronic devices. Some dynamic memories have the possibility of setting the memory into a power down mode but the maximum duration of this power down mode at a time is restricted to the length of the refresh sequence, after which the memory has to be reset into a normal mode for the duration of the refreshing.

SUMMARY OF THE INVENTION

One purpose of the present invention is to reduce the power consumption of dynamic memories especially in situations when the electronic device is in a power down mode. The invention is based on the idea that the dynamic memory is divided into blocks which can be refreshed irrespective of each other, information on the location of each application program to be executed is stored, as well as on the quantity of memory allocated by each application program to be executed, and that it is determined which of memory blocks contains information requiring maintenance, wherein the memory refresh is conducted primarily in those blocks which contain information that has to remain unaltered. The method according to the present invention is primarily characterized in what will be presented in the characterizing part of the appended claim 1. The electronic device according to the present invention is characterized in that the electronic device also comprises means for dividing the memory cells into two or more blocks, means for refreshing each block substantially irrespective of each other, and means for defining the need to maintain the information to be stored at a given time, wherein information on the need to maintain the information to be stored in the memory cells at a given time is arranged to be defined at least partly on the basis of the storage locations allocated for the application programs, and that the means for refreshing the memory cells comprise means for determining on the basis of said stored information which of said memory blocks contains information requiring maintenance, wherein other memory blocks are arranged to remain unrefreshed.

With the present invention, significant advantages are achieved when compared with solutions of prior art. With the method according to the invention it is possible to reduce the power consumption of dynamic memories significantly without affecting the rate or other corresponding functional parameters of the dynamic memory. Especially in power down modes, the power consumption of electronic devices utilizing the memory according to the invention can be maintained on a considerably lower level when compared to using memories of prior art, wherein the operating time of such electronic devices is increased, which is especially advantageous in portable electronic devices. In addition to the increased operating time, it is also possible to avoid using a battery of higher capacity. Thus in the electronic device, it is possible to avoid the increase in size and weight caused by a larger and heavier power supply. The invention also enables reducing the power supply, if there is no need to increase the operating time but it can be maintained on its current level. This enables reducing the size of the electronic device in some cases.

Figure 2:
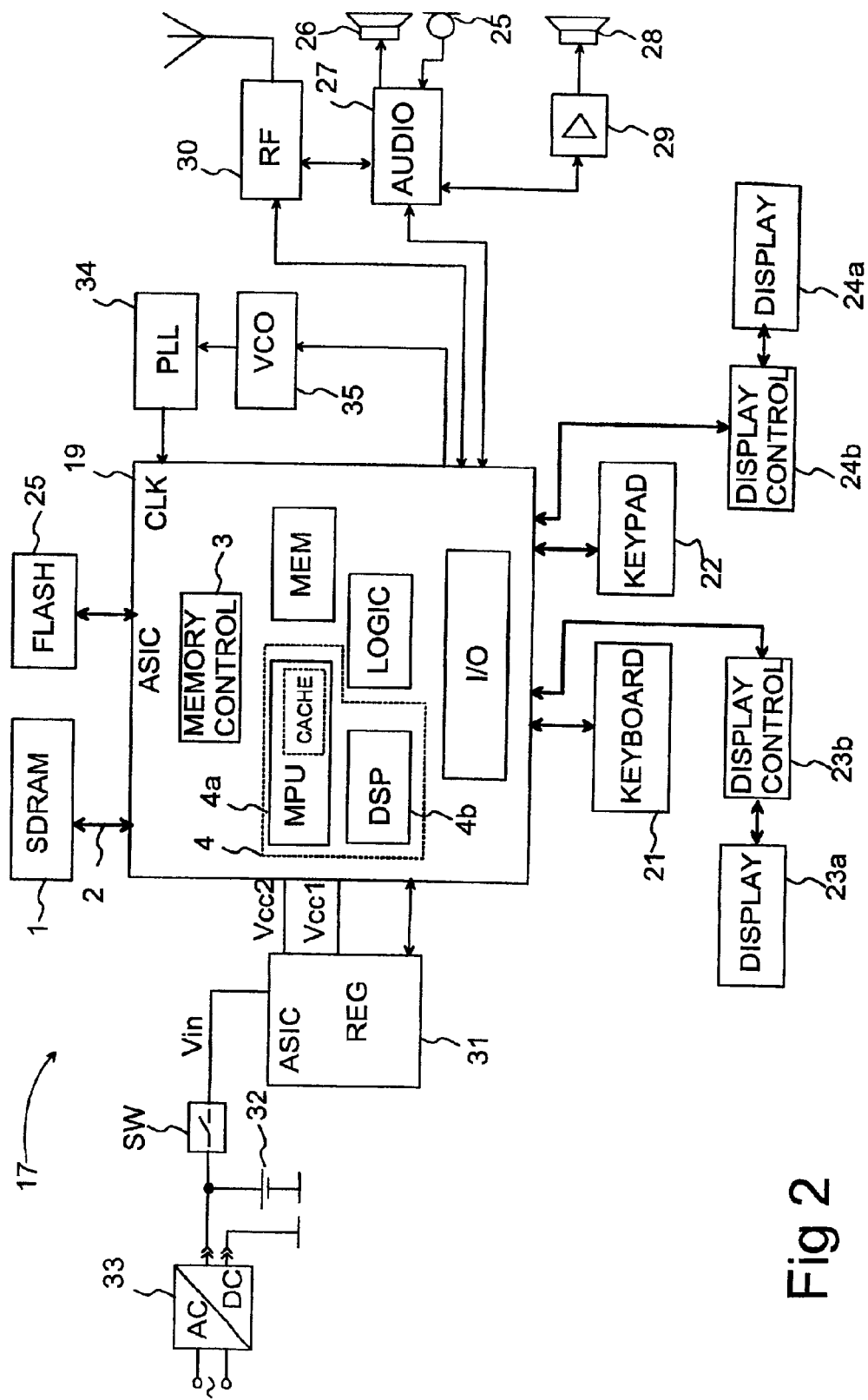

In the following, the present invention will be described in detail with reference to the appended drawings in which FIG. 1 shows a dynamic memory according to a preferred embodiment of the invention and a control logic of the same in a reduced block diagram, and FIG. 2 shows an electronic device according to a preferred embodiment of the invention.

DETAILED DESCRIPTION OF THE PREFERRED EMBODIMENT(s)

FIG. 1 is a reduced block diagram showing the structure of a dynamic memory 1 according to a preferred embodiment of the invention, as well as an interface bus 2 needed in its control and a memory controller 3. In this embodiment, the memory controller 3 is implemented in connection with a processor 4 (FIG. 2), but the invention can also be applied in such electronic devices in which the memory controller 3 is implemented as a separate unit or integrated in connection with the memories 1. Furthermore, it is obvious that at least part of the dynamic memory 1, the interface bus 2, the memory controller 3, and the processor 4 can also be implemented so that they are integrated in an ASIC circuit.

In the dynamic memory 1 according to the invention, the memory cells are divided into blocks 5a–5d, in which the memory cells are advantageously organized in a matrix format, as is known as such. The dynamic memory 1 also comprises a command decoder 6 in which a control logic 7 is controlled on the basis of control signals passing through the interface bus 2. The dynamic memory 1 also comprises a mode selection register 8, a column address buffer 9, a row address buffer 10, a data control block 11, a latch 12, and a data buffer 13. Furthermore, the memory blocks 5a–5d are provided with a row selector 14, a column selector 15 and an amplifier 16. It is obvious that the division of memory cells into the four blocks 5a–5d only provides an example here, and within the scope of the invention, in practical embodiments, the number of the blocks can be different from that presented herein. It should also be mentioned that the row selectors 14, the column selectors 15 and the amplifiers 16 are arranged separately for each memory block 5a–5d.

The dynamic memory 1 has to be provided with operational parameters in connection with the start-up. This is conducted by programming the desired operational parameters into the mode selection register 8. In order to program the mode selection register in the dynamic memory 1 according to this example, the memory controller 3 sets a chip select line CS, address strobe lines RAS, CAS and a write enable line WE in the interface into an active mode. In this example, said lines are active in a low state, and thus the lines CS, RAS, CAS, WE are set in the logical 0 state. The operational parameters are transmitted to the mode selection register 8 via an address bus in which one or more address bus lines are allocated for each parameter for the purpose of transmitting the value of the parameter. Thus, when setting the aforementioned lines, the memory controller 3 also sets the values corresponding to the desired operating mode, for example a CAS latency and the length of the burst in a burst-nocle transfer, into the bits of the address bus. The CAS latency is used to indicate the time passed in the process of reading the data from the memory, from the act of writing a reading command in the memory 1 to the moment when it can be read in the data bus. The CAS latency time is reported in clock sequences, for example 1, 2 or 3 clock sequences, depending on the speed of the memory and on the frequency of the clock signal. The mode selection register is programmed for example in the ascending edge of the clock signal when the lines CS, RAS, CAS, WE are in the active state. The above-described programming of the mode selection register 8 has to be conducted also when an operational parameter is changed, which is known as such.

In order to address the dynamic memory 1, the memory controller 3 sets the circuit selecting line CS into an active state, which in this embodiment means a voltage rating corresponding to the logical 0 state, in practice approximately 0 V. In case of an operation of writing into the memory 1, the write enable line WE is set in an active state for the duration of the writing operation. If the address bus contains an address corresponding to the row address, the memory controller 3 sets the row address strobe line RAS indicating this row address into an active state. Thus the command decoder 6 interprets the command in question as a writing command and the address as a row address. The command decoder 6 establishes a control for the control logic 7, which produces a strobe signal for the row address buffer 10, to transfer the row address from the address bus to the output of the row address buffer 10, wherein the address is transmitted to the row selectors 14a–14d. At the next stage, the memory controller 3 sets the column address to the address bus and the corresponding column address strobe line CAS into an active state. Before that, the memory controller 3 has set the row address strobe line RAS into a non-active state (e.g. logical 1 state). Correspondingly, the column address is transmitted via the column address buffer 9 to column selectors 15a 15d. The memory controller 3 also sets the data to be written in the storage location indicated in the data bus, which data is transmitted via the latch 12 to the data control block 11 and further to the memory matrix. The control logic 7 is responsible for selecting the correct block 5a–5d and for establishing timings for the address buffers 9, 10, for the data control block 11 and for the latch 12.

The row address buffer 10 of the dynamic memory is advantageously provided with a referesh counter which is used to conduct a self refresh procedure when no data is written in or read from the dynamic memory 1. The self refresh procedure is controlled by means of the control logic 7 and the mode selection register 8 for example in such a way that the control logic 7 examines the mode selection register 8 to find out which blocks require refreshing and selects such blocks to be refreshed at intervals. The address (row address) of the refresh location is obtained from the refresh counter, which is advantageously increased by one after each refresh operation. Thus the next self refresh procedure is conducted for the following row.

When utilizing burst nocle, the initial address is written from the memory controller 3 to the dynamic memory 1. The column address buffer 9 of the dynamic memory is provided with a column address counter, which is used in burst node to select the correct column address at a given time. The data transfer and the stepping of the column address counter are synchronized with the clock signal. The following is a description on the function of the dynamic memory 1 according to a preferred embodiment of the invention shown in FIG. 1. As an example, it is presumed that the dynamic memory contains 64 Mbit (megabits) of memory organized into words of 16 bits in width, i.e. approximately four million words, and that these words are divided into four blocks 5a–5d. Thus, each block comprises 1 048 576×16 memory cells. Consequently, two block selecting lines BA0, BA1 are required for selecting the block, as well as 20 bits for indicating the words in the block. In an advantageous dynamic memory, the coding for indicating the words is arranged in a multiplexed manner in such a way that twelve address lines of the address bus AD, advantageously the lines AD0–AD11, are used to define the row address, and eight address lines, advantageously the lines AD0–AD8, are used to define the column address. For the sake of clarity, in the appended figures these lines of the address bus AD are not shown separately, but as a single bus. It is obvious that the address bus AD can contain a larger number of lines than the lines AD0–AD11 mentioned in this example, but that is not significant for understanding the invention.

Furthermore, to control the dynamic memory 1 according to a preferred embodiment of the invention, two address strobe lines RAS, CAS, and one clock line CLK are used, as well as a clock enable line CKE, by means of which the coupling of the clock signal to the dynamic memory can be controlled.

Data is written advantageously in the following way. The starting address of the desired writing point in the dynamic memory 1 is set for example in two phases in the addres bus AD; first the row address and then the column address, or vice versa. The block is selected with a block selecting command, in connection with which block selecting information is transmitted in these block selecting lines BA0, BA1. At the same time, a row address is advantageously also transmitted. Thus, the row address and the block selecting information is transmitted by the row address strobe line RAS. Correspondingly, the column address is transmitted to the column address buffer by the column address strobe line CAS. The address is formulated for example in such a way that the most significant part of the starting address of the writing point (marked b0–b19), for example the bits b8–b19, are set as a row address, in such a way that b8 is set to be the value for the least significant bit AD0 of the address bus, b9 is set to be the value for the next least significant bit AD1 of the address bus, etc. The least significant part in the starting address of the writing point, in this case bits b0–b7, is set as a column address advantageously in such a way that b0 is set to be the value of the least significant bit AD0 of the address bus, b1 is set to be the next least significant bit AD1 of the address bus, etc. Furthermore, the memory controller 3 sets the chip select line CS of the dynamic memory 1 to which the memory operation is directed, into an active state.

From the row address buffer 10, the address information is transmitted to the row selector 14a–14d, whereby a memory cell row corresponding to the target area is selected from the memory matrix 5a–5d. Correspondingly, from the column address buffer 9, the address is transmitted to the column selector 15a–15d, which selects the corresponding column from the memory matrix 5a–5d. At the next stage, the data to be stored in the dynamic memory 1 is set to the data bus D.

In this context, it should be mentioned that for the sake of clarity, the lines D0–D15 of the data bus D are not marked separately in the appended figures, but are shown in a single bus. It is obvious that the data bus D can contain a different number of lines than the 16 used in this example.

The clock signal is transmitted to the control logic 7 via the clock line CLK. This clock line is also used for processing most of the internal timings of the dynamic memory 1. The control logic 7 provides the data buffer 13 with control signals to determine the transfer direction of the data in the data buffer 13 (read/write). When writing the data, the direction from the data bus D to the memory matrix 5a–5d is set as a direction data, wherein data is transmitted to the memory matrix 5a–5d for example on the ascending or descending edge of the clock signal. In practice, the data buffer 13 is composed of two separate bus buffers with opposite directions, both buffers being provided with a so-called three-condition output. Such a three-condition output can be set in a floating position when the output is not active. This enables using the same data bus D for both writing and reading, which is known as such.

Also from the dynamic memory 1 data is read primarily by following the above-presented principles. The most substantial difference is that the state of the read/write line WE is set to another state, in this example to the logical 1 state, which causes the transfer direction of the data to be reversed in the data buffer 13 when compared with the situation of writing the data. When the address data is transmitted to the row selector 14a–14d and to the column selector 15a–15d, the control logic 7 is used to control the data transmission from the memory matrix 5a–5d to the output of the data buffer 13, wherein data can be read from the data bus D. Data is read for example on the descending edge of the clock signal.

The present invention can be advantageously applied in connection with the dynamic memory 1 for example in such a way that the refreshing of each memory block 5a–5d can be controlled separately. Thus, data on those memory blocks 5a–5d which at a given time contain data to be retained, is written for example in the mode selection register. Such memory blocks are refreshed in a conventional manner. However, memory blocks which do not contain information to be retained, are not subjected to refresh procedures. This alternative is suitable for such dynamic memories which are provided with means for conducting the refreshing, wherein an external refresh logic is not necessary.

In a second preferred embodiment of the invention, a dynamic memory 1 is refreshed in connection with the memory controller 3. Thus, the memory controller 3 contains data indicating which memory areas include information which does not have to be retained. Such areas can be left unrefreshed, if they have such a size and location in the dynamic memory 1 that the refresh logic is able to distinguish these areas. In practical applications, it is not reasonable to implement refresh operation according to the invention in such a way that each memory cell can be refreshed or left unrefreshed, but the memory cells are treated in larger entities, for example in rows, or blocks composed of several rows.

FIG. 2 is a reduced block diagram showing an electronic device 17, in connection with which the invention can be advantageously applied. In this example, the electronic device 17 is a communication device comprising data processing functions and mobile station functions. A major part of the functions of the electronic device 17 is implemented in a first ASIC circuit 19. This first ASIC circuit 19 comprises for instance a first processor 4a which is advantageously a so-called general purpose RISC processor, i.e. reduced instruction set computer. Furthermore, the first ASIC circuit 19 comprises a second processor 4b, i.e. a digital signal processor (DSP), in which signal processing functions are typically implemented. The first ASIC circuit 19 also comprises memory means MEM which can be partly shared by the first 4a and the second processor 4b, logic couplings LOGIC, and an interface logic I/O. The couplings between these different blocks of the ASIC circuit 19 are not shown in detail in FIG. 2, because they are prior art known as such by anyone skilled in the art. FIG. 2 shows one further block of the first ASIC circuit 19, i.e. a so-called cache memory CACHE, which is used in connection with the invention, especially in connection with the external dynamic memory 1 in a way described hereinbelow. Furthermore, the electronic device 17 can also comprise other external memory means, such as a FLASH memory.

To the first ASIC circuit 19, a keyboard 21 is coupled, which in this embodiment is a keyboard used primarily in connection with data processing functions, advantageously a so-called QWERTY keyboard. A keypad 22, used primarily in mobile station functions, is also coupled to this first ASIC circuit. In this embodiment, the electronic device 17 also comprises two display devices 23a, 24a, which are controlled by display drivers 23b, 24b. The first display device 23a is primarily used in connection with data processing functions, and the second display device 24a is primarily used in connection with mobile station functions. It is obvious that said keyboard 21 and keypad 22, and the first display device 23a and the second display device 24a can be used in connection with both mobile station functions and data processing functions, if necessary. A microphone 25 and a receiver 26 are coupled via an audio block 27 to the first ASIC circuit 19. This audio block 27 contains a codec, by means of which, for instance during an audio call, a microphone signal is converted to a digital signal, and the digital speech signal is converted to an analog signal to be transmitted to the receiver 26. The electronic device 17 advantageously also comprises a speaker 28, to which the audio signal is transmitted advantageously via an audio amplifier 29. The speaker 28 is primarily used when the electronic device 17 is for example on a table in a position in which it is possible to use the data processing functions, or in a situation when a call is to be heard by several people nearby, or in a hands-free mode in a vehicle.

The electronic device 17 of FIG. 2 also comprises a high frequency section 30 (RF, Radio Frequency), by means of which calls are transmitted between the electronic device 17 and a mobile communication network (not shown) in a way known as such.

Furthermore, the electronic device 17 comprises a power supply circuit 31, which in this embodiment is also implemented as an ASIC circuit. This power supply circuit 31 comprises means for generating operating voltages $V_{CC1}$, $V_{CC2}$ from a supply voltage $V_{IN}$. The supply voltage $V_{IN}$ is advatageously generated by means of a battery 32, which is loaded with a loading device 33 when necessary.

In FIG. 2, the interface between the dynamic memory 1 and the first ASIC circuit 19 is marked as a single bus 2. The dynamic memory 1 is composed of memory cells organized in matrix format in one or more blocks and illustrated by blocks 5a–5d in FIG. 1.

To control the functions of the electronic device 17, the electronic device 17 is provided with one or more operating systems, or the like, which contain functions for controlling the functional units of the electronic device 17, and possibly means for executing different application programs, or the like. The operating system is composed of a group of program commands of the processors, which commands are executed by the processor 4a, 4b. In multiprocessing operating systems, there may be several application programs under execution simultaneously. Thus, the operating system takes care of the execution turns of the different application programs, memory allocations, signal transmission between the functional blocks of the electronic device, e.g. transmitting the keystrokes to the correct application program, etc. These operating system functions are known as such by anyone skilled in the art.

When starting the application program, its program code is either executed from the program memory or transmitted to the random access memory, for example to the dynamic memory 1. Furthermore, a space is allocated for the application program from the dynamic memory to store data temporarily. Also for the operating systems, a dynamic memory is allocated for temporary storing of data. Thus, in different situations, the need for memory can vary considerably. Furthermore, the simultaneous use of several programs can have a significant effect on the quantity of memory allocated at a given time. In the method according to a preferred embodiment of the invention, the processor 4a, 4b stores information on the location of each application program to be executed, as well as on the quantity of memory allocated by the same. On the basis of this information the processor 4a, 4b knows whether there are such memory areas in the dynamic memory 1 which can be left unexecuted. For example, the dynamic memory 1 according to FIG. 1 contains four memory blocks, the refresh procedure being separately controllable in each. Thus, if a memory block does not contain any such memory cells whose information is to be retained, the memory controller 3 is informed of the fact by the processor 4a, 4b. After that the memory controller 3 does not refresh such memory blocks. If a refresh logic is implemented in the dynamic memory 1, the memory controller 3 transmits information on the free memory areas to the dynamic memory 1, for example in the operational parameters of the mode selection register 8. Thus, in the dynamic memory 1, the refresh logic refreshes such blocks which contain information to be retained.

When starting up a new application program, for example when receiving an incoming call in a communication device, the processor allocates a data memory from the dynamic memory 1. The memory allocation is conducted advantageously in such a way that the allocated areas are located substantially successively in the dynamic memory 1. Thus, the free memory also exists in more uniform entities, and therefore it is easier to implement the refreshing and the act of leaving the refreshing unexecuted. When the call is finished, the memory area allocated for the telephone application is deallocated, wherein this area does not have to be refreshed any more.

During a call, the data processing functions are not necessarily used, and thus it is not necessary to refresh the memory area allocated for the data processing functions, or it can be utilized by the telephone application if necessary.

It is obvious that the present invention is not restricted solely to the embodiments presented above, but it can be modified within the scope of the appended claims.

What is claimed is:

1. A method for refreshing memory cells in a dynamic memory comprising:

executing application programs under control of an operating system;

allocating the memory cells successively in the dynamic memory for the application programs;

using the memory cells for storing the application programs;

conducting refreshing to maintain the application programs in the memory cells;

dividing the application programs stored in the memory cells at a given time into application programs to be maintained and application programs. not requiring maintenance, wherein at least some of such memory cells which contain application programs not requiring maintenance, remain unrefreshed;

dividing the memory cells of the dynamic memory into two or more blocks which can be refreshed irrespective of each other;

storing information on the location of each application program to be executed and information on the quantity of memory allocated for each application program to be executed; and utilizing the operating system to determine on the basis of said stored information which of said memory blocks contains information requiring maintenance, wherein other memory blocks remain unrefreshed.

2. The method according to claim 1, characterized in that the dynamic memory (1) is a synchronous dynamic memory.

3. The method according to claim 1, characterized in that the dynamic memory (1) is an asynchronous dynamic memory.

4. An electronic device comprising:

a dynamic memory with memory cells for storing application programs;

means for refreshing the memory cells;

means for executing the application programs;

means for successively allocating a memory area from the dynamic memory for each application program for the duration of its execution;

means for deallocating said memory area after the execution of the application program;

means for dividing the memory cells into two or more blocks;

means for refreshing each block substantially irrespective of each other; and means for defining the need to maintain at least one of the application programs to be stored at a given time, wherein information on the need to maintain the at least one application program to be stored in the memory cells at a given time is arranged to be defined at least partly on the basis of the storage locations allocated for the application programs, and wherein the means for refreshing the memory cells comprise means for determining on the basis of said stored information which of said memory blocks includes application programs requiring maintenance, wherein other memory blocks are arranged to remain unrefreshed.

5. The electronic device (17) according to claim 4, characterized in that the dynamic memory (1) comprises a synchronous dynamic memory.

6. The electronic device (17) according to claim 4, characterized in that the dynamic memory (1) comprises an asynchronous dynamic memory.

7. The electronic device (17) according to claim 4, characterized in that it is a communication device comprising mobile station functions.

* * * * *